United States Patent
Manapragada et al.

(10) Patent No.: US 6,693,490 B2
(45) Date of Patent: Feb. 17, 2004

(54) ADJUSTABLE GAIN CONTROL SYSTEM AND METHOD THEREOF

(75) Inventors: Praveen Manapragada, Round Rock, TX (US); Stephen W. Dow, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 33 days.

(21) Appl. No.: 10/092,968

(22) Filed: Mar. 7, 2002

(65) Prior Publication Data

US 2003/0169114 A1 Sep. 11, 2003

(51) Int. Cl.[7] .................................................. H03F 3/26
(52) U.S. Cl. ....................................... 330/274; 330/282
(58) Field of Search ................................ 330/224, 282, 330/254, 278; 327/354

(56) References Cited

U.S. PATENT DOCUMENTS

| | | | | |
|---|---|---|---|---|
| 5,805,236 A | * | 9/1998 | Roth | ........................... 330/295 |
| 6,307,429 B1 | * | 10/2001 | Olgaard | ....................... 330/129 |
| 6,353,401 B1 | * | 3/2002 | Aswell et al. | ............... 341/118 |
| 6,452,449 B1 | * | 9/2002 | Saito | ........................... 330/254 |

* cited by examiner

*Primary Examiner*—Khanh Van Nguyen
(74) *Attorney, Agent, or Firm*—Posz & Bethards, PLC; Charles W. Bethards

(57) ABSTRACT

An adjustable gain control (AGC) system with improved gain control accuracy and method thereof is disclosed. The system includes an offset circuit for providing an offset signal that is selectable; a gain setting source for providing a gain set signal that is dependent on a desired gain and the offset signal; and an AGC circuit, coupled to the offset signal and gain set signal, for providing a gain control signal, the AGC circuit compensating, according to the offset signal, the gain control signal for process variables corresponding to the AGC circuit to provide a plurality of predetermined gains for the amplifier that correspond, respectively, to a plurality of desired gains indicated by respective gain select signals.

26 Claims, 7 Drawing Sheets

ADJUSTABLE GAIN CONTROL SYSTEM AND METHOD THEREOF

FIELD OF THE INVENTION

This invention relates in general to communication equipment, and more specifically to an improved adjustable gain control system, an integrated circuit amplifier using such system, and methods thereof.

BACKGROUND OF THE INVENTION

Communications equipment such as receivers and transmitters that use or require gain control are known. Due to the wide variety of communications systems defined by various standards and deployed by various carriers and the desire to field equipment that operates in a plurality of these systems the demands or requirements for adjustable gain control approaches and systems have grown. Many of present and planned systems are designed to be interference limited. In such systems signal levels need to be as closely controlled as practical. In the end that means that the gain or amplification of signal processing line-ups used in equipment deployed in such systems is also critical. Thus requirements for the accuracy and repeatability of adjustable gain control systems have become more stringent. At the same time size and cost pressures on the equipment as well as complexity of the equipment mandate the use of as much integrated functionality as possible.

Thus most adjustable gain control systems and many amplifiers whose gain must be controlled are in integrated circuit form. Many of these gain control systems have various forms of compensation for some performance variables, such as large signal current gains and for some environmental variables such as temperature. However known gain control systems have suffered from inaccuracies due to random mismatches of process variables and mismatches due to process gradients. Thus known systems have suffered with respect to repetitively providing known predetermined levels of gain control over multiple gain settings and across multiple copies of the same system. Clearly a need exists for an improved adjustable gain control system and methods thereof.

SUMMARY OF THE INVENTION

This invention concerns communications equipment and improved apparatus and methods for adjustable gain control. In one aspect the invention is an adjustable gain control (AGC) system with improved gain control accuracy for an analog amplifier. The AGC system includes an offset circuit for providing an offset signal that is selectable; a gain setting source for providing a gain set signal that is dependent on a gain select signal and the offset signal; and an AGC circuit, coupled to the offset signal and the gain set signal, for providing a gain control signal for the analog amplifier, the AGC circuit compensating, according to the offset signal, the gain control signal for process variables corresponding to the AGC circuit to provide a plurality of predetermined gains for the amplifier that correspond, respectively, to a plurality of gain select signals.

In a further aspect the invention is an integrated circuit amplifier having an adjustable gain control characteristic where the integrated circuit includes a low noise amplifier (LNA) having a gain control input coupled to a gain control signal for amplifying an input signal according to the gain control signal to provide an output signal; and a gain control system with adjustable gain control (AGC) for providing the gain control signal. The gain control system includes an offset circuit for providing an offset signal that is selectable; a gain setting source for providing a gain set signal that is dependent on a desired gain and the offset signal; and an AGC circuit, coupled to the offset signal and the gain set signal, for providing the gain control signal for the LNA, the AGC circuit compensating, according to the offset signal, the gain control signal for process variables corresponding to the AGC circuit to provide a plurality of predetermined gains for the amplifier that correspond, respectively, to a plurality of gain select signals indicative of a plurality of respective desired gains.

A method aspect of the invention is a method in an adjustable gain control (AGC) system of providing improved gain control for an analog amplifier. The method includes providing an offset signal that is selectable; providing a gain set signal that is dependent on a desired gain and the offset signal; and generating, responsive to the offset signal and the gain set signal, a gain control signal for the analog amplifier, and compensating, according to the offset signal, the gain control signal for process variables corresponding to the AGC system to provide a plurality of predetermined gains for the amplifier that correspond, respectively, to a plurality of gain select signals.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION OF PREFERRED EMBODIMENT

In overview the present disclosure concerns methods and apparatus that enable communications equipment that provide services for users thereof. More particularly various inventive concepts and principles embodied in methods, apparatus, and integrated circuits (ICs) for improved adjustable gain control systems are discussed and disclosed. The communications equipment of particular interest are cellular devices or handsets or the like that must operate in multiple systems that require multiple closely controlled gains for signal processing functions within such handsets, devices, and communicators. Such circumstances may be encountered, for example, in a cellular phone or handset that operates in, for example, GSM, CDMA, and traditional cellular systems, or GSM, GPRS, and 3G systems.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions. Much of the inventive functionality and many of the inventive principles are best implemented with or in various semiconductor circuits and processes. It is expected that one of ordinary skill, notwithstanding possibly significant effort and many design choices motivated by, for example, available time, current technology, and economic considerations, when guided by the concepts and principles disclosed herein will be readily capable of generating such circuits in accordance with the design rules of the appropriate semiconductor processes with minimal experimentation. Therefore further discussion of such circuits and processes, if any, will be limited to the essentials of the preferred embodiments all in the interest of brevity and minimization of any risk of obscuring the principles and concepts according to the present invention.

Figure 1:
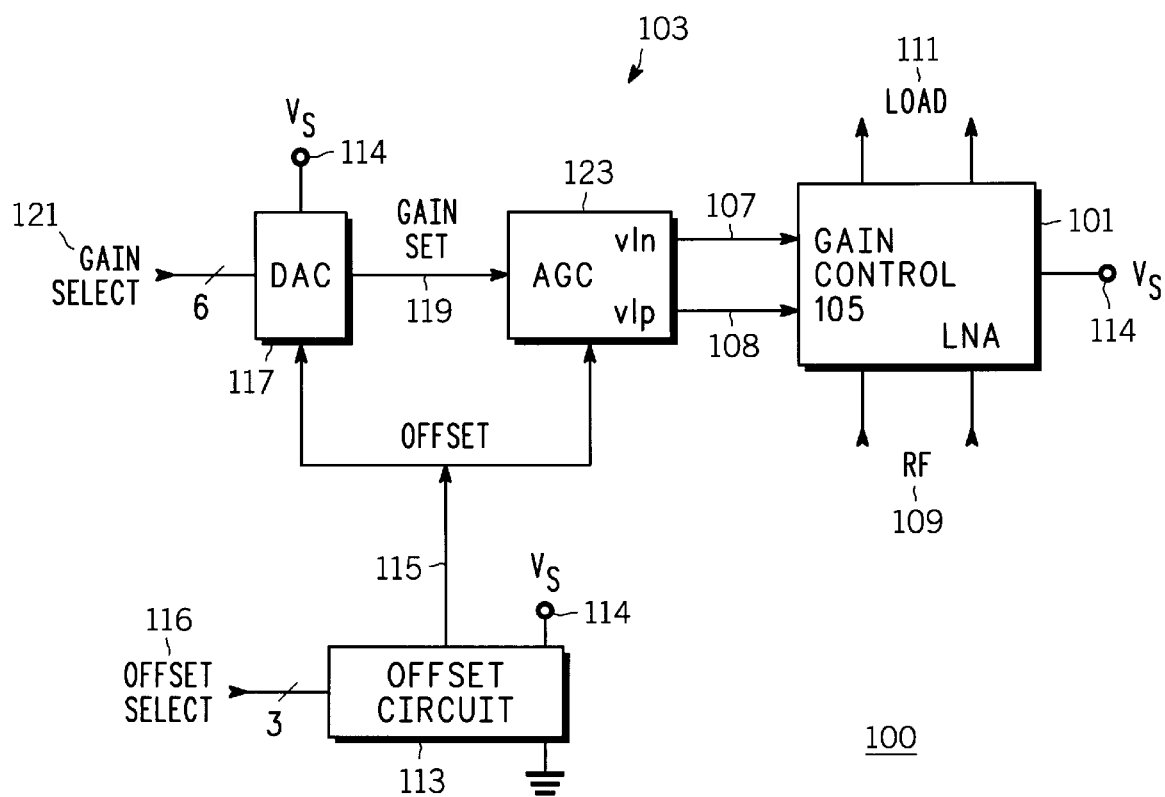
FIG. 1 depicts a block diagram of a preferred embodiment of an amplifier and adjustable gain control system in accordance with the present invention.

The FIG. 1 depiction of a block diagram of a preferred embodiment of an amplifier and adjustable gain control system will now be described. This block diagram depicts an amplifier 101 that has an adjustable gain or gain control characteristic that is supplied or controlled by a gain control system 103. Preferably the amplifier is an integrated circuit amplifier, such as a low noise amplifier (LNA) or other analog amplifier with an adjustable gain control characteristic. It is desirable for this gain characteristic to be a predetermined relationship between desired or selected gains and gains actually produced by the amplifier that can be repetitively and accurately produced over a plurality of units and circumstances.

The integrated circuit amplifier includes, preferably, a low noise amplifier (LNA) 101 having a gain control input 105 coupled to a gain control signal 107, 108, preferably a differential signal, for amplifying an input signal 109, preferably a radio frequency signal, according to the gain control signal 107, 108 to provide an output signal 111, preferably a differential output signal, to a load such as a radio frequency mixer or the like. Further included is the gain control system 103 with adjustable gain control (AGC) for providing the gain control signal and essentially assuring that the gain control characteristic is obtained. In the preferred form the amplifier and the gain control system will be integrated in a common integrated circuit with one such embodiment being a radio frequency integrated circuit offered by Motorola under various designations, such as i.250 GSM/GPRS Platform. This integrated circuit is suitable for construction on Silicon Germanium, Bipolar and CMOS (BiCMOS) processes as are generally known and not further discussed other than if and when the specifics have relevancy to the principles and concepts disclosed herein.

The gain control system includes an offset circuit 113 for providing an offset signal 115 that is preferably selectable via a select signal or an offset select signal at a select input 116. As will be discussed in more detail below with reference to FIG. 2, the offset circuit is referenced to Vs__114 and ground and generates a plurality of available offset signals, preferably according to predetermined resistor ratios, which as is known are relatively stable with variations in temperature and process gradients found in semiconductor processes. This arrangement preferably provides a nominal offset signal equal to ac ground or Vs/2. The available offset signals are preferably multiples of 20 milli-volt increments around Vs/2. In operation and as indicated via the select signal, the offset circuit selects 1 of 8 of the available offset signals according, preferably to a 3 bit select signal at 116 to provide the offset signal 115. A preferred approach or apparatus for the offset circuit is a digital to analog converter that receives a digital select signal and responsive thereto provides the offset signal.

Further included in the adjustable gain control system is a gain setting source 117 for providing a gain set signal 119 that is dependent on a desired gain provided, preferably as a gain select signal at input 121 and the offset signal 115. As will be discussed in further detail below with reference to FIG. 3, the gain setting source preferably generates a plurality of available gain set signals according to predetermined resistor ratios, given their stability in semiconductor processes as known and noted earlier, where the available gain set signals are dependent on the offset signal 115. The gain set source is referenced between Vs and the offset voltage that as note above is Vs/2+/−__n (20 mv). Given the nominal Vs of 2.75 volts the available gain set signals are spaced approximately every 22 mvs. The gain setting source in one embodiment selects 1 of 64 of these available gain set signals according to a 6 bit gain select signal to provide the gain set signal 119. In one embodiment, the gain setting source 117 includes a digital to analog converter that receives a digital gain select signal at input 121 and responsive thereto provides the gain set signal at 119.

One final block in the adjustable gain control system of the integrated circuit shown in FIG. 1 is an AGC circuit 123, coupled to the offset signal 115 and the gain set signal 119, for providing the gain control signal 107, 108 for the LNA 101. The AGC circuit compensates, according to the offset signal, the gain control signal for process variables corresponding to the AGC circuit to provide a plurality of predetermined gains for the amplifier that correspond, respectively, to a plurality of desired gains as indicated by the gain select signals. As will be further discussed below with reference to FIG. 5 the AGC circuit includes a feedback loop to provide a log linear gain control signal wherein a logarithm of the plurality of predetermined gains is a linear function of the plurality of desired gains. The AGC circuit with the feedback loop is able to accurately and repetitively provide this log linear gain control signal such that the linear function has a predetermined gain slope, preferably 50 dB per volt. The AGC circuit with the feedback loop provides the log linear gain control signal by using the offset signal to compensate for offsets or mismatches due to such variables as voltage threshold and base emitter junction variations.

Figure 2:
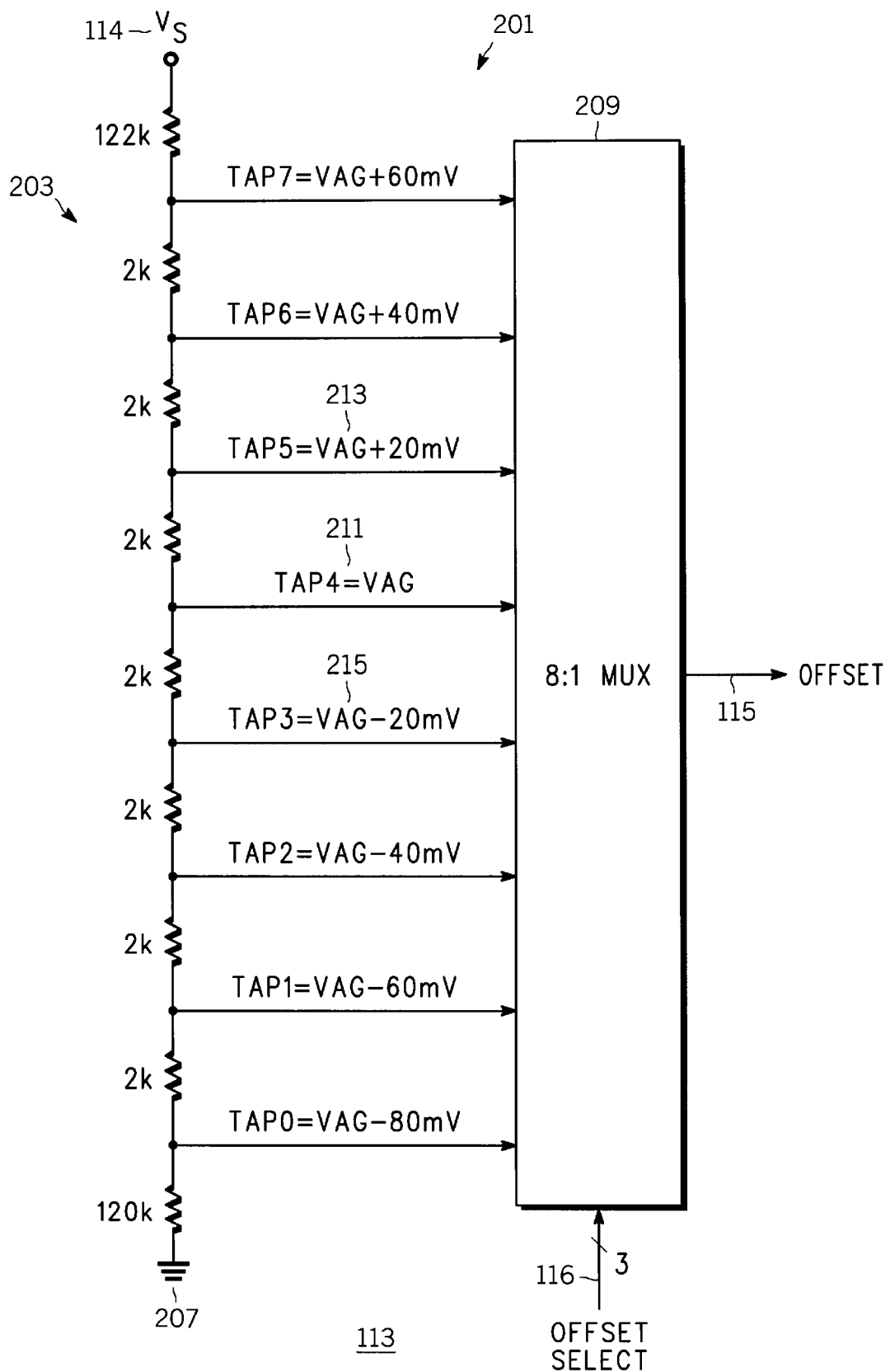
FIG. 2 depicts a block diagram of a preferred embodiment of an offset circuit for use in the FIG. 1 system according to the present invention.

FIG. 2 depicts a block diagram of a preferred embodiment of an offset circuit for use in the FIG. 1 system. The offset circuit provides the offset signal 115 that is selectable. The offset circuit 113 is essentially and preferably a digital to analog (DAC) circuit 201 modified according to the concepts and principles herein to generate a plurality of available offset signals according to predetermined resistor ratios such that these signals have the appropriate and desired predetermined properties and relationships one to another as further noted below. Included in the offset circuit is an R-Ladder 203. The R-ladder 203 is a series connected plurality of resistors connected between Vs 114 and ground 207. The plurality of available offset signals are, each, available at one of taps 0–7. As is known the voltage or signal at a tap, such as tap 4 will be proportional to the voltage or potential across the R-ladder times the ratio of the resistance from the tap4 211 to ground 207 divided by the total resistance of the R-ladder 203 assuming that the current load at that tap is negligible. Given the resistor values indicated, the voltage will be Vs×128K/256K=0.5 Vs or approximately Vs/2 at tap 4. Given the small current load at a tap the nominal voltage at tap 4 is Vs/2 or ½ supply often referred to as AC ground or Vag as depicted in the preferred embodiment. At a Vs=2.8 V the resistor values have been selected so that each tap is nominally 20 millivolts in potential from its nearest neighbor taps, eg either greater than or less than Vag or Vs/2 by n×20 mv. For example tap 5 213 is 20 mv greater and tap3 215 is 20 mv less than Vag. The 8 available offset signals are coupled to a 8:1 multiplexer or mux 209 that selects 1 of the 8 available offset signals at taps 0–7 according to a select signal or 3 bit digital offset select signal at input 116 to provide the offset signal 115. The properties and characteristics of the offset signal or available offset signals have been selected, being mindful of the address space and implications of changing that, to provide an appropriate number of available offset signals, range of available offset voltages and step size between the available offset signals that is required for compensation of the gain control signal as further discussed below.

Figure 3:
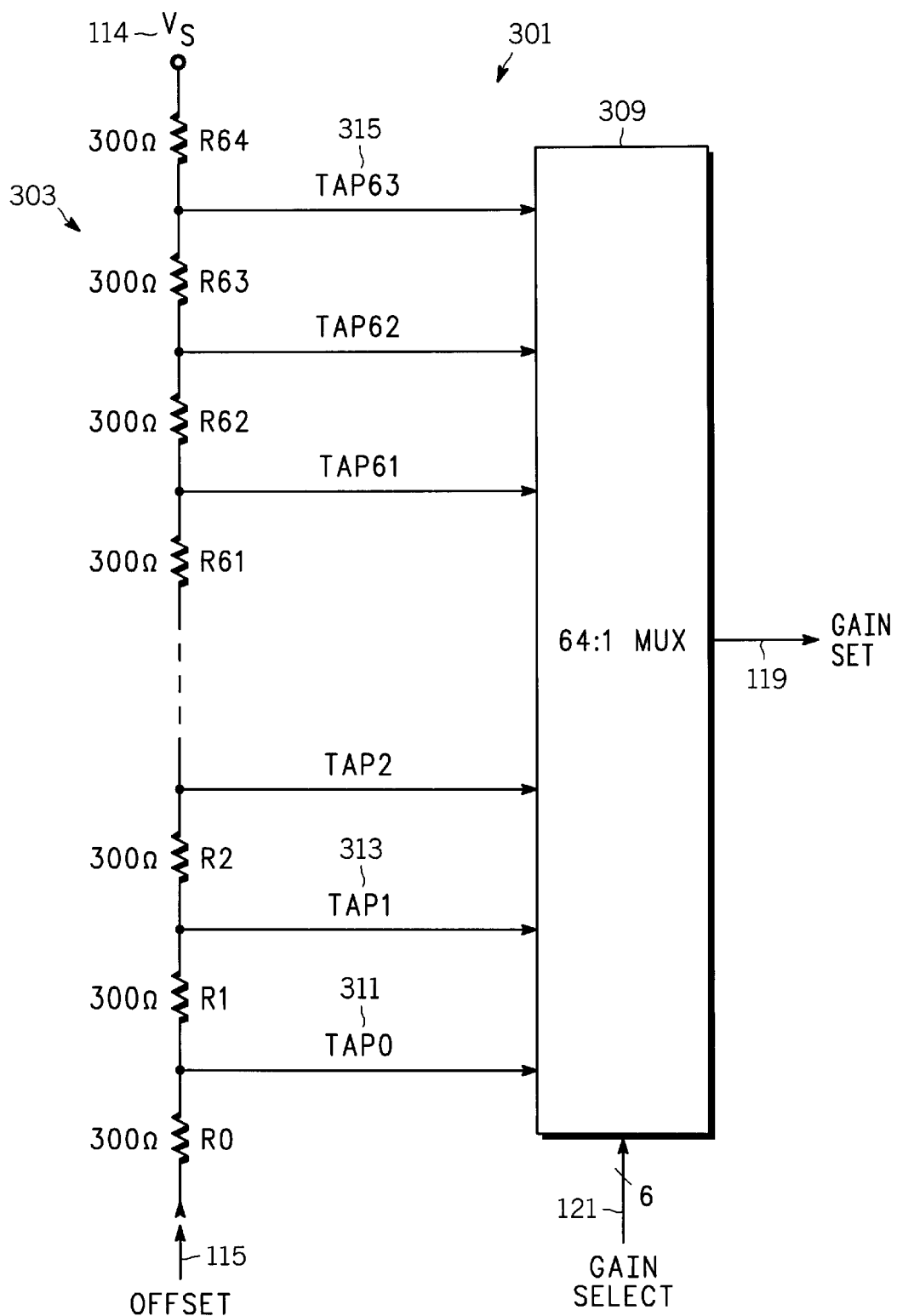
FIG. 3 illustrates a block diagram of a preferred embodiment of a gain setting source suitable for use in the FIG. 1 system in accordance with the present invention.

FIG. 3 illustrates a block diagram of a preferred embodiment of the gain setting source 117 suitable for use in the FIG. 1 system. The gain setting source provide a gain set signal 119 that is dependent on a desired gain at 121 and on the offset signal 115. The gain setting source 117 is essentially and preferably a DAC circuit 301 modified according to the concepts and principles herein to generate a plurality of available gain set signals that are dependent on the offset signal 115 and according to predetermined resistor ratios such that these signals have the appropriate and desired predetermined properties and relationships one to another as further noted below. Included in the offset circuit is an R-Ladder 303. The R-ladder 303 is a series connected plurality of, preferably equal valued, 300 ohm, resistors, designated R0–R64, that are connected between Vs 114 and the offset signal 115 as depicted. The plurality of available gain set signals are, each, available at one of taps 0–63. As is known the voltage or signal at a tap, such as tap 0 311 will be proportional to the voltage or potential across the R-ladder times the ratio of the resistance from the tap 0 311 to the reference potential or here the offset signal 115 divided by the total resistance of the R-ladder 303, assuming the current load at that tap is negligible, added to the reference potential or here the offset signal. Given the resistor values indicated, the voltage at tap 0 will be equal to the offset signal 115 plus (Vs−(offset signal=Vag+/−n×20 mv=Vs/2+/−n×20 mv))×300/65×300. If n=0 hence the offset signal=Vs/2 the voltage across R0 will be Vs/130 or approximately 22 mv given Vs=2.8 volts. At a Vs=2.8 V the resistor values and ratios have been selected so that each tap is approx 22 milli-volts in potential from its nearest neighbor taps either greater than or less than the neighbor tap. For example tap 1 313 is 22 mv greater than tap0 311. Since the offset signal can vary up or down in increments of 20 mv the voltage at a given tap will also vary in proportion to these 20 mv increments according to the relevant resistor ratio. For example a change of 20 mv in the offset signal will cause tap 0 to change by 64/65 of the 20 mv while tap 63 315 will change only 1/65 of the 20 mv increment. The 64 available gain set signals are coupled to a 64:1 multiplexer or mux 309 that selects 1 of the 64 available gain set signals at taps 0–63 according and responsive to a gain select signal or 6 bit digital gain select signal at input 121 to provide the gain set signal 119. The properties and characteristics of the gain set signal 119 or available gain set signals have been selected and determined, being mindful of the address space and implications of changing that, to provide an appropriate number of available gain set signals, range of available gain set voltages and step size between the available gain set signals that is required for compensation of the gain control signal as further discussed below. Although not mentioned the offset select and gain select signals are expected to be provided by a controller that is arranged to interface to the gain control system according to known techniques.

Figure 4:
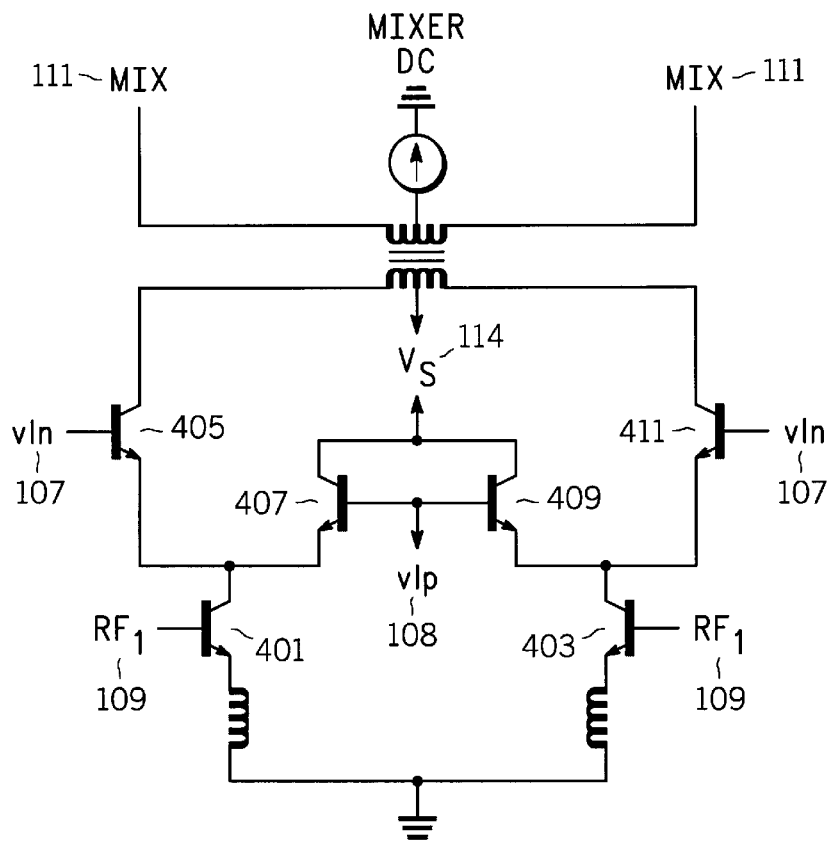
FIG. 4 depicts in representative form a schematic of an amplifier suitable for use in the FIG. 1 system.

FIG. 4 depicts in representative form a schematic of an amplifier suitable for use in the FIG. 1 system. This is a simplified functional schematic of the relevant portion of an analog amplifier, preferably a LNA 101 that is generally known. The LNA is arranged for amplifying a differential input signal available at 109 that is preferably a radio frequency signal coupled to transistors 401 and 403. Each of transistors 401, 403 are coupled at their respective collectors to a pair of transistors, respectively 405, 407 and 411, 409. These transistor pairs 405, 407 and 411, 407 are, respectively, coupled at the gain control input 105 to the gain control signal 107, 108 at their base terminals, with vln 107 going to transistors 405 and 411 and vlp 108 going to transistors 407 and 409. Transistors 405 and 411 operate to provide an output signal at 111 to a load such as a mixer. The gain control signal vlp—vln is a differential signal that via the two transistor differential pairs controls the amplification of the LNA thereby providing an adjustable gain characteristic by steering the RF signal current and DC current components from transistors 401, 403 either into the load or the supply Vs. As the gain control signal increases meaning vlp increases and vln decreases, the bias current in transistors 405, 411 decreases while the bias current coming from Vs 114 via transistors 407, 409 increases, thus decreasing the gain of the LNA or increasing the amount of attenuation that is provided relative to the gain that was provided for the previous state of the gain control signal.

Figure 5:
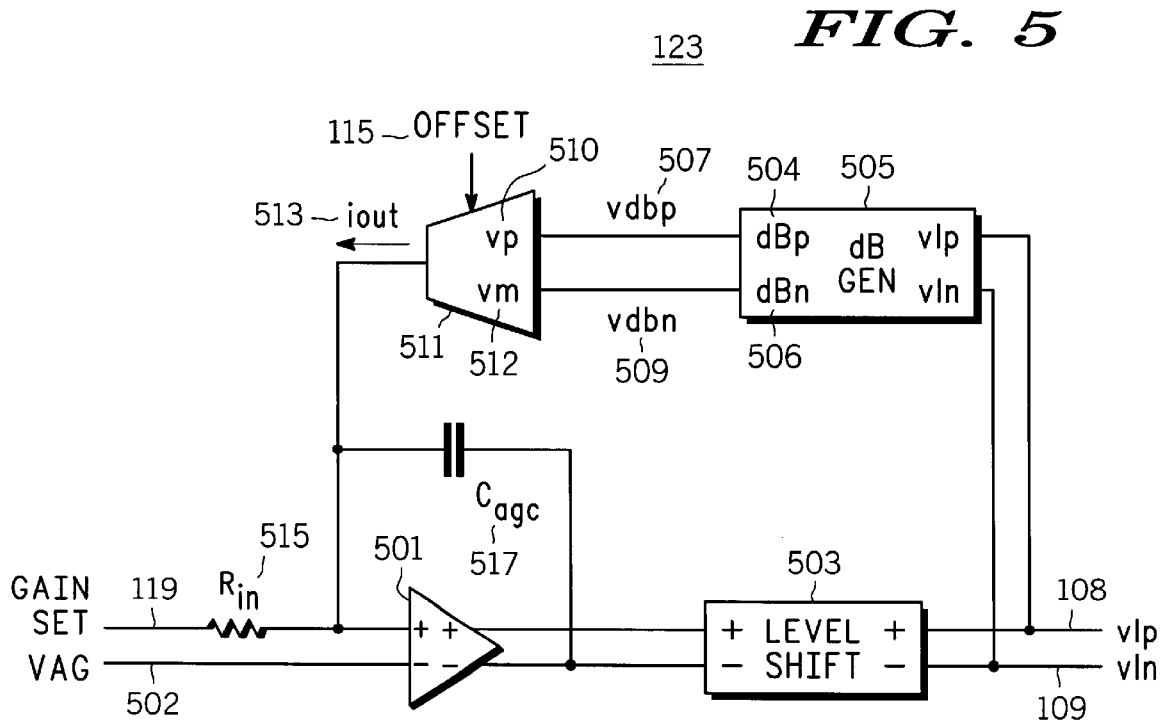
FIG. 5 shows a more detailed block diagram of a preferred embodiment of the AGC function suitable for use in the system of FIG. 1 according to the present invention.

FIG. 5 shows a more detailed block diagram of a preferred embodiment of the AGC function or circuit 123 that is suitable for use in the system of FIG. 1. The AGC circuit 123 includes an AGC differential amplifier 501 that is coupled at the input to the gain set signal 119 and Vag or Vs/2 with the polarities indicated and operates to provide around 27 dB of gain to provide a level shifted gain control signal that is then dc level shifted (from approximately 2.63 V to 1.9 V to account for a signal swing of +/−180 mv on vlp and vln) at 503 to provide the gain control signal or attenuation signal (vlp−vln) 108−107 to be provided to the LNA or analog amplifier. The AGC circuit operates to compensate, according to the offset signal the gain control signal for process variables such as Width to Length ratio variation and other threshold and mismatch variables known to those skilled in the semiconductor design and fabrication fields in order to provide a plurality of predetermined gains for the amplifier that correspond, respectively, to a plurality of desired gains as provided at 121. This is accomplished by coupling the gain control signal to a feedback loop that includes the dB generator 505 with an output 504, 506 that couples a differential signal vdbp–vdbn 507,509 to an AGC_gm amplifier 511 at an input 510, 512. The AGC_gm amplifier has an output that provides an iout signal 513 back to the positive node of the AGC differential amplifier 501 where the gain set signal 119 is coupled through a resistor Rin 515. The AGC circuit including the feedback loop operates to provide a log linear gain control signal wherein a logarithm of the plurality of predetermined gains is a linear function of the plurality of desired gains. Furthermore the AGC circuit with this feedback loop provides the log linear gain control signal such that the linear function has a predetermined gain slope. This is accomplished by using the offset signal 115 as coupled to the AGC-gm amplifier to compensate, for example for offsets, such as those caused or resulting from or due to voltage thresholds and base emitter junction variations.

Figure 6:
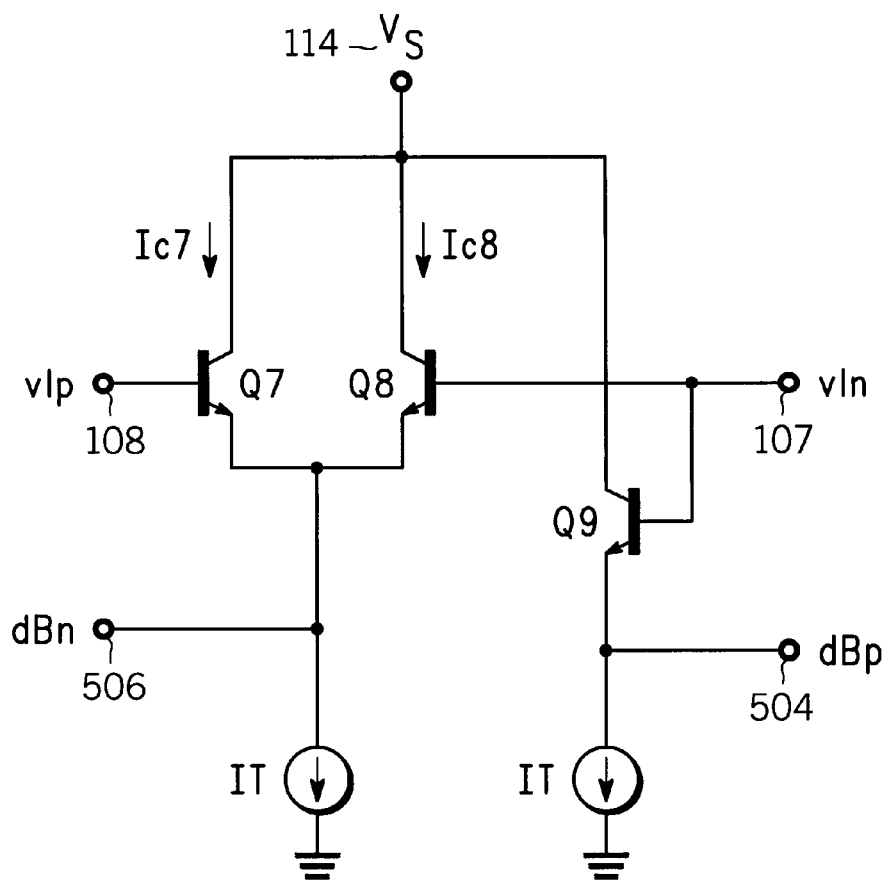
FIGS. 6 and 7 depict representative schematics of preferred embodiments for functional blocks within the FIG. 5 AGC function.
Figure 7:
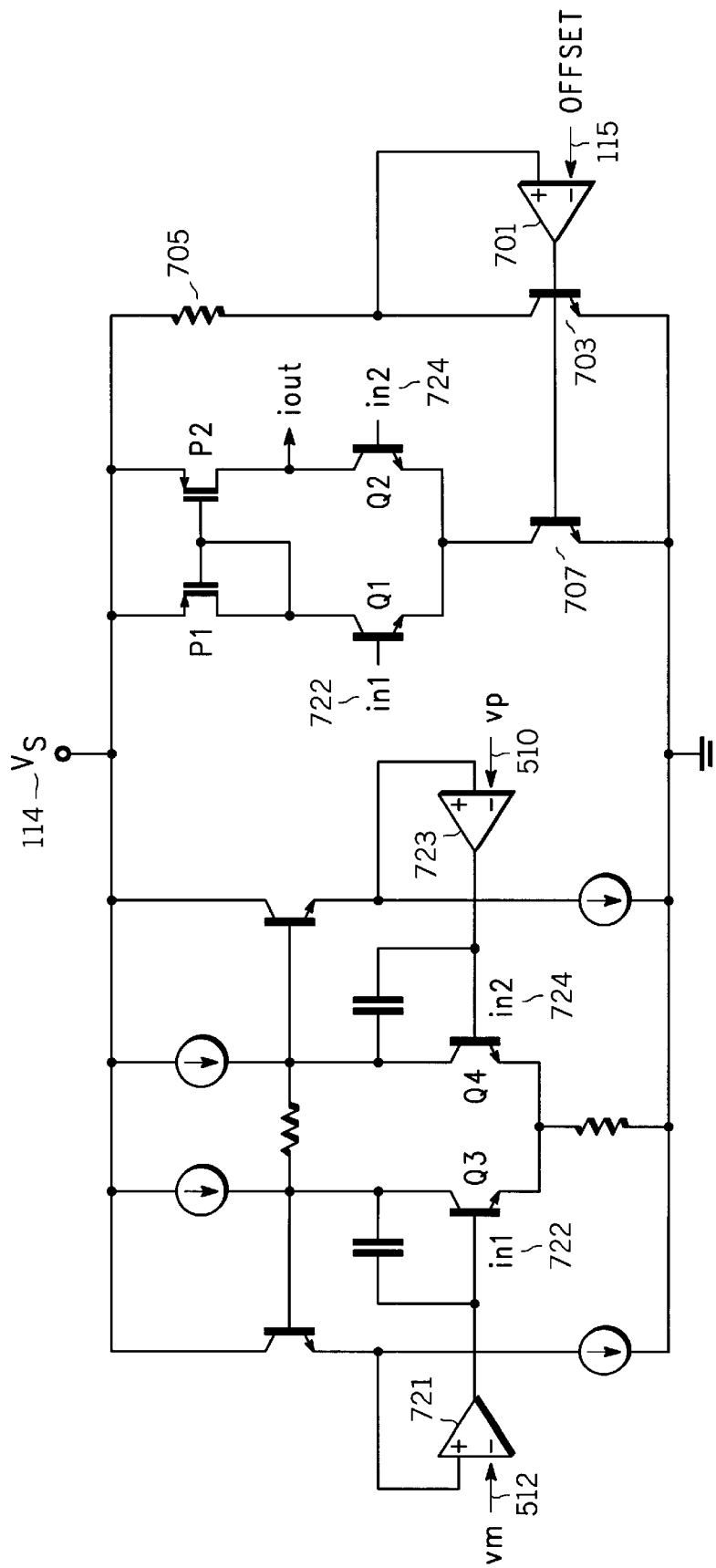

FIG. 6 and FIG. 7 depict representative simplified schematics of preferred embodiments for the dB generator 505 and AGC-gm amplifier 511 suitable for use within the FIG. 5 AGC circuit. FIG. 6 is the schematic for the dB generator 505 and is coupled at 108, 107 to the differential gain control signal vlp–vln. Note that as vlp increases and vln decreases, responsive to an increase in the gain set signal 119, the voltage 509 at dBn 506 will increase and the voltage 507 at dBp 504 will decrease. This forms a differential voltage signal vdbp–vdbn 507, 509 that drives the AGC-gm amplifier discussed below with reference to FIG. 7. The differential pair of transistors Q7 and Q8 will experience, respectively an increase and decrease in collector current Ic7 and Ic8 with the sum of the two currents totaling It. Note that since vlp–vln also drives the LNA there will be a corresponding, essentially identical, decrease in bias or collector current in transistor 405 and 411 and increase in collector current in transistors 407 and 409. This will reduce the gain of the LNA or increase the present amount of attenuation in the LNA. As is known it can be shown that the differential voltage vdbp–vdbn is linearly proportional in dB to the current ratio Ic8/It or Ic7/It with the first ratio corresponding to reduction in gain or increase in attenuation for the LNA and the latter corresponding to increasing gain or decreasing attenuation. Note these ratios will be less than 1 (one) since Ic8+Ic7=It. This is referred to as log linear function meaning that each unit change in the ratio will result in a certain number of dB change in the differential voltage. Note that the same ratio and change in ratio of the currents in the dB generator are occurring in the LNA as both are driven by the same signal and configured in the same fashion. In equation form (vdbp–vdbn)=$V_T$*ln(Ic8/It) where $V_T$ is k*T/q where k=Boltzman's constant, T=temperature in Kelvin, q=charge of an electron. $V_T$=26 mV at T=300K. Note that vdbp=vdbn until vdbp goes negative so vdbp–vdbn is a negative number that increases in magnitude as Ic8 decreases.

FIG. 7 is a simplified schematic of the AGC_gm amplifier 511 that operates as a trans-conductance amplifier with a gain of gm, to convert the differential voltage vdbp–vdbn into a current, iout 513, to be summed at the positive input node of the AGC differential amplifier 501. As is known the current at this node must sum to zero. The current through Rin 515 is the voltage across Rin divided by Rin. The voltage across Rin, hereafter referred too as Vogs is the gain set signal less Vag=Vs/2 where the gain set signal will be dependent on the offset signal 115, as earlier explained, and will range from approximately Vs/2 up to approximately Vs, depending on the desired gain chosen at 121 and the offset signal 115. Thus Vogs/Rin+(vdbp–vdbn)*gm=0 or Vogs/Rin=–(vdbp–vdbn)*gm. Substituting from above for (vdbp–vdbn), Vogs/Rin=–$V_T$*ln (Ic8/It)*gm. Thus as the current through Rin increases with increasing Vogs, Ic8 decreases and the ln of the current ratio becomes a larger negative number meaning that iout is larger, flowing away from the node of the AGC diff amp as we would expect. This can be rewritten as:

$$ln(Ic8/It)=-Vogs/V_T*Rin*gm$$

Therefore the attenuation in dB at the LNA, provided by the current steering transistors or stages 405, 407 and 411, 409 is linearly related to an increasing gain set signal or the gain in dB is linearly related to a decreasing gain set signal. Thus the AGC circuit including the feedback loop provides a log linear gain control signal wherein a logarithm of a plurality of predetermined gains is a linear function of a plurality of desired gains Referring to FIG. 7 the differential voltage vdbp–vdbn is coupled to the input vm 512 and vp 510. Continuing with the scenario where vlp increases and vln decreases which resulted in vdbp decreasing and vdbn increasing (vdbp–vdbn increasingly larger negative magnitude), vm will increase and vp will decrease. As vm increase the output of inverter 721 will decrease and in1 722 will decrease. Similarly for vp decreasing, the output of inverter 723 will increase and in2 will increase. Thus the collector current in Q1 will decrease and in Q2 will increase. As the collector current in Q1 decreases the current in through the FET transistor P1 will decrease and that will be mirrored by a decrease in P2. The decrease in current through P2 and increase in current through Q2 must be provided by iout. Thus iout will be a larger negative value. The offset signal 115 is used within the AGC_gm amplifier as follows. Whatever level the offset signal 115 is set to, the output from inverter 701 will cause collector current through transistor 703 that is sufficient to result in a voltage drop across resistor 705 so that the other non-inverting input of 701 which is coupled to the collector will have a voltage equal to the offset voltage. Since transistors 703 and 707 are matched transistor 707 will be driven identically and will have very nearly the same collector current as transistor 703. The current in the collector of transistor 707 establishes gm for the AGC-gm amplifier and thus the gain slope or slope of the log linear gain control signal. The offset signal can be selected to overcome threshold voltage mismatches between P1 and P2 as well as base emitter mismatches between and amongst Q1–Q4. Since the offset signal also effects the gain set signal modest variations to correct for offsets or mismatches in threshold voltages of P2 and P1 will be canceled out of the loop results. By adjusting the offset signal the proper slope and origin is set for the desired gain control curve. In this fashion the AGC circuit with the feedback loop provides a log linear gain control signal, preferably with a predetermined gain slope, wherein a logarithm of a plurality of predetermined gains is a linear function of a plurality of desired gains. The offset signal 115 is used in the feedback loop compensate for offsets due to one of voltage threshold and base emitter junction variations.

Figure 8:
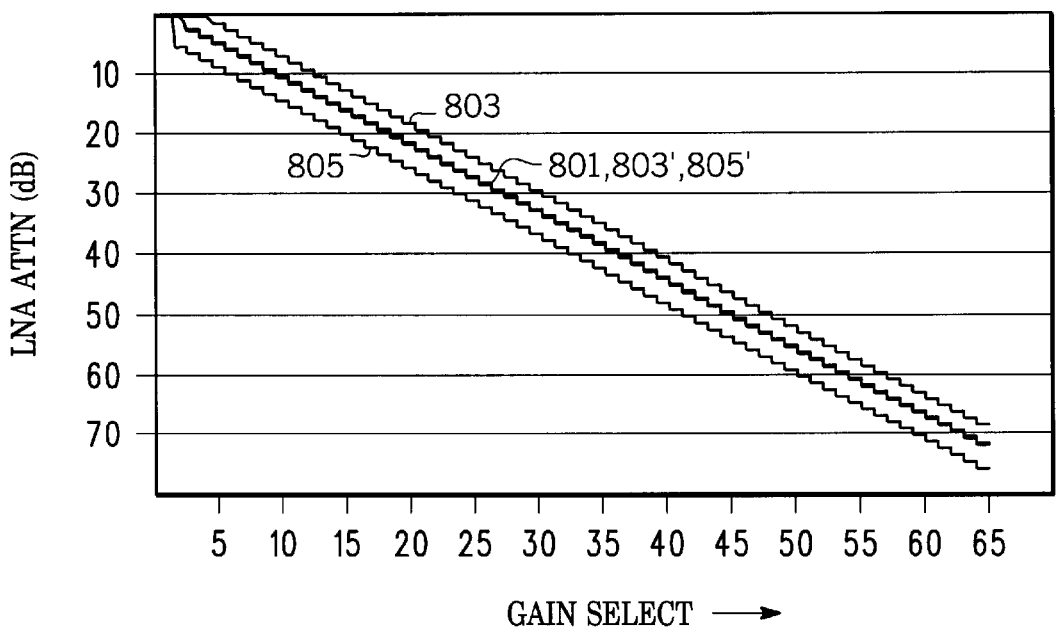
FIGS. 8 and 9 illustrate performance results for an experimental version of the FIG. 1 system.
Figure 9:
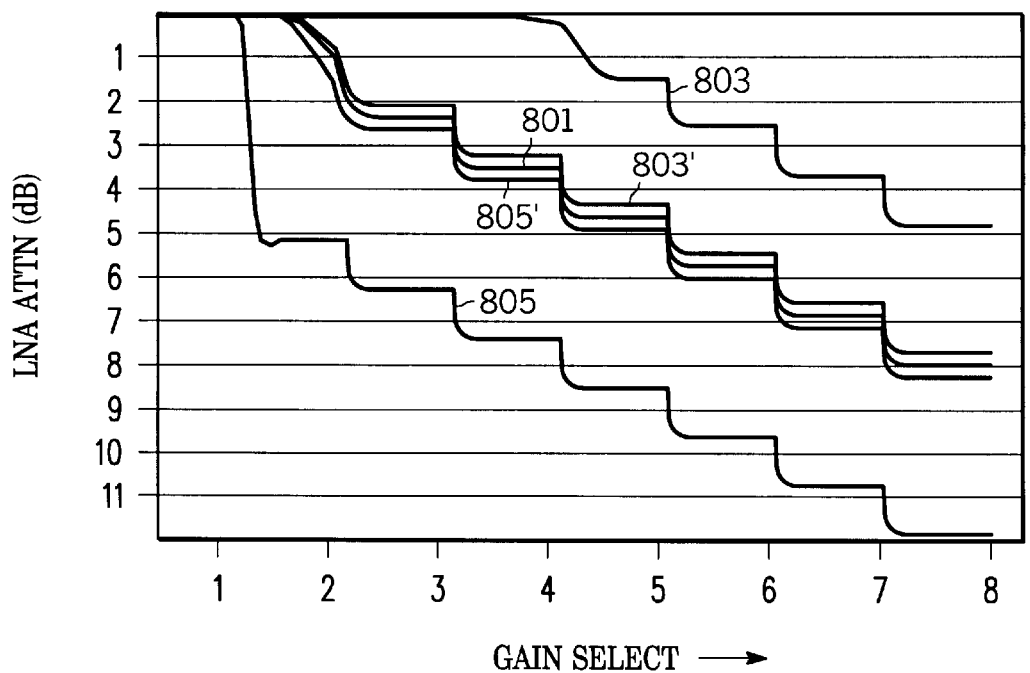

FIGS. 8 and 9 illustrates performance results for an experimental version of the FIG. 1 system. FIG. 8 shows an ideal gain curve 801 that shows the gain select 6 bit input on the horizontal axis and the LNA attenuation or gain reduction on the vertical axis. Also shown are two other gain curves that are log linear but suffer from an offset of +80 mv for curve 805 and –60 mv for curve 803. By observation the distance between the two offset curves is approximately 10 dB. Also shown are curves 803' and 805' which are the same curves with the principles and concepts discussed above applied. These curves were generated by incrementing the gain select signal approximately once every 16 microseconds. FIG. 9 illustrates the same curves as FIG. 8 but over the first 8 gain selections and the vertical axis has been expanded for greater resolution. By observation one can see how closely the compensated curves 803', 805' follow the ideal curve 801 even at these resolutions. The low pass response due to capacitor 517 results in the rounded nature of these curves as the gain select input is varied over time.

The above discussion has explained an adjustable gain control (AGC) system with improved gain control accuracy that may be used for an analog amplifier such as a LNA as in the system of FIG. 1. The AGC system includes as has been discussed an offset circuit for providing an offset signal that is selectable; a gain setting source for providing a gain set signal that is dependent on a desired gain and said offset signal; and an AGC circuit, coupled to the offset signal and the gain set signal, for providing a gain control signal, where the AGC circuit compensates, according to the offset signal, the gain control signal for process variables corresponding to the AGC circuit to provide a plurality of predetermined gains for the amplifier that correspond, respectively, to a plurality of desired gains.

The offset circuit generates a plurality of available offset signals according to predetermined resistor ratios and selects 1 of 8 of the available offset signals according to a 3 bit select signal to provide the offset signal. The preferred form of the offset circuit is a DAC modified as discussed to receive the 3 bit digital select signal and responsive thereto provides the offset signal. Similarly, he gain setting source generates a plurality of available gain set signals according to predetermined resistor ratios, the available gain set signals dependent on the offset signal and selects 1 of 64 of the available gain set signals according to a 6 bit gain select signal to provide the gain set signal. A DAC suitably modified to receive a 6 bit digital gain select signal and responsive thereto provides the gain set signal is preferred.

The AGC circuit has been explained just above. Our initial discussion concerned an integrated circuit amplifier having a adjustable gain control characteristic, that included a low noise amplifier (LNA) having a gain control input coupled to a gain control signal for amplifying an input signal according to the gain control signal to provide an output signal; and the gain control system above.

A method in an adjustable gain control (AGC) system of providing improved gain control for an analog amplifier, the method suitable for implementation in an integrated circuit or otherwise includes providing an offset signal that is selectable; providing a gain set signal that is dependent on a desired gain and the offset signal; and generating, responsive to the offset signal and the gain set signal, a gain control signal for the analog amplifier, and compensating, according to the offset signal, the gain control signal for process variables corresponding to the AGC system to provide a plurality of predetermined gains for the amplifier that correspond, respectively, to a plurality of desired gains.

The process of providing the offset includes supplying a plurality of available offset signals according to predetermined resistor ratios and selecting, based on a digital select signal, one of the plurality of available offset signals to provide the offset signal. The offset signals discussed above would be one version that is appropriate. Providing the gain set signal further includes generating a plurality of available gain set signals according to predetermined resistor ratios, the available gain set signals dependent on the offset signal and selecting, based on a digital gain select signal, one of the plurality of available gain set signals to provide the gain set signal.

Generating the gain control signal further includes providing a log linear gain control signal, preferably having a predetermined gain slope, wherein the logarithm of the plurality of predetermined gains is a linear function of the plurality of desired gains. Generating the gain control signal further includes using the offset signal to compensate for offsets in the AGC system, due, for example, to voltage threshold offsets and base emitter junction variations.

The processes, discussed above, and the inventive principles thereof are intended to and will alleviate problems caused by prior art adjustable gain control systems. Using these principles of generating and using offset signals to compensate for process variables will simplify manufacturing of components and end communications equipment alike and provide better and more reproducible overall adjustable gain control functionality. It is expected that these system, method, and integrated circuit embodiments or others in accordance with the present invention will have application to many present and future products deployed in various wide and local area networks. Using the inventive principles and concepts disclosed herein advantageously allows or provides for accurate gain control across a large number of units and a wide variation in fabrication variables.

This disclosure is intended to explain how to fashion and use various embodiments in accordance with the invention rather than to limit the true, intended, and fair scope and spirit thereof. The invention is defined solely by the appended claims, as may be amended during the pendency of this application for patent, and all equivalents thereof.

What is claimed is:

1. An adjustable gain control (AGC) system with improved gain control accuracy for an analog amplifier, the AGC system comprising in combination:

an offset circuit for providing an offset signal that is selectable;

a gain setting source for providing a gain set signal that is dependent on a gain select signal and said offset signal; and an AGC circuit, coupled to said offset signal and said gain set signal, for providing a gain control signal for the analog amplifier, said AGC circuit compensating, according to said offset signal, said gain control signal for process variables corresponding to said AGC circuit to provide a plurality of predetermined gains for the analog amplifier that correspond, respectively, to a plurality of gain select signals.

2. The adjustable gain control (AGC) system of claim 1 wherein said offset circuit generates a plurality of available offset signals according to predetermined resistor ratios.

3. The adjustable gain control (AGC) system of claim 2 wherein said offset circuit selects 1 of 8 of said available offset signals according to a 3 bit offset select signal to provide said offset signal.

4. The adjustable gain control (AGC) system of claim 1 wherein said offset circuit includes a digital to analog converter that receives a digital select signal and responsive thereto provides said offset signal.

5. The adjustable gain control (AGC) system of claim 1 wherein said gain setting source generates a plurality of available gain set signals according to predetermined resistor ratios, said available gain set signals dependent on said offset signal.

6. The adjustable gain control (AGC) system of claim 5 wherein said gain setting source selects 1 of 64 of said available gain set signals according to a 6 bit gain select signal to provide said gain set signal.

7. The adjustable gain control (AGC) system of claim 1 wherein said gain setting source includes a digital to analog converter that receives a digital gain select signal and responsive thereto provides said gain set signal.

8. The adjustable gain control (AGC) system of claim 1 wherein said AGC circuit further includes a feedback loop to provide a log linear gain control signal wherein a logarithm of said plurality of predetermined gains is a linear function of said plurality of gain select signals corresponding to a plurality of desired gains.

9. The adjustable gain control (AGC) system of claim 8 wherein said AGC circuit further including said feedback loop to provide said log linear gain control signal such that said linear function has a predetermined gain slope.

10. The adjustable gain control (AGC) system of claim 8 wherein said AGC circuit further including said feedback loop to provide said log linear gain control signal uses said offset signal to compensate for offsets due to one of voltage threshold and base emitter junction variations.

11. An integrated circuit amplifier having an adjustable gain characteristic, the integrated circuit amplifier comprising in combination:
   a low noise amplifier (LNA) having a gain control input coupled to a gain control signal for amplifying an input signal according to said gain control signal to provide an output signal; and
   a gain control system with adjustable gain control (AGC) for providing said gain control signal, the gain control system comprising;
      an offset circuit for providing an offset signal that is selectable;
      a gain setting source for providing a gain set signal that is dependent on a gain select signal and said offset signal; and
      an AGC circuit, coupled to said offset signal and said gain set signal, for providing said gain control signal for said LNA, said AGC circuit compensating, according to said offset signal, said gain control signal for process variables corresponding to said AGC circuit to provide a plurality of predetermined gains for the low noise amplifier that correspond, respectively, to a plurality of gain select signals.

12. The integrated circuit amplifier of claim 11 wherein said offset circuit generates a plurality of available offset signals according to predetermined resistor ratios.

13. The integrated circuit amplifier of claim 12 wherein said offset circuit selects 1 of 8 of said available offset signals according to a 3 bit offset select signal to provide said offset signal.

14. The integrated circuit amplifier of claim 11 wherein said offset circuit includes a digital to analog converter that receives a digital select signal and responsive thereto provides said offset signal.

15. The integrated circuit amplifier of claim 11 wherein said gain setting source generates a plurality of available gain set signals according to predetermined resistor ratios, said available gain set signals dependent on said offset signal.

16. The integrated circuit amplifier of claim 15 wherein said gain setting source selects 1 of 64 of said available gain set signals according to a 6 bit gain select signal to provide said gain set signal.

17. The integrated circuit amplifier of claim 11 wherein said gain setting source includes a digital to analog converter that receives a digital gain select signal and responsive thereto provides said gain set signal.

18. The integrated circuit amplifier of claim 11 wherein said AGC circuit further includes a feedback loop to provide a log linear gain control signal wherein a logarithm of said plurality of predetermined gains is a linear function of said plurality of gains select signals corresponding to a plurality of desired gains.

19. The integrated circuit amplifier of claim 18 wherein said AGC circuit further including said feedback loop to provide said log linear gain control signal such that said linear function has a predetermined gain slope.

20. The integrated circuit amplifier of claim 18 wherein said AGC circuit further including said feedback loop to provide said log linear gain control signal uses said offset signal to compensate for offsets due to one of voltage threshold and base emitter junction variations.

21. A method in an adjustable gain control (AGC) system of providing improved gain control for an analog amplifier, the method including the steps of:
   providing an offset signal that is selectable;
   providing a gain set signal that is dependent on a gain select signal and said offset signal; and
   generating, responsive to said offset signal and said gain set signal, a gain control signal for the analog amplifier, and compensating, according to said offset signal, said gain control signal for process variables corresponding to the AGC system to provide a plurality of predetermined gains for the analog amplifier that correspond, respectively, to a plurality of gain select signals.

22. The method of claim 21 wherein said providing said offset signal includes supplying a plurality of available offset signals according to predetermined resistor ratios and selecting, based on a digital offset select signal, one of said plurality of available offset signals to provide said offset signal.

23. The method of claim 21 wherein said providing said gain set signal further includes generating a plurality of available gain set signals according to predetermined resistor ratios, said available gain set signals dependent on said offset signal and selecting, based on a digital gain select signal, one of said plurality of available gain set signals to provide said gain set signal.

24. The method of claim 21 wherein said generating said gain control signal further includes providing a log linear gain control signal wherein a logarithm of said plurality of predetermined gains is a linear function of said plurality of gain select signals corresponding to a plurality of desired gains.

25. The method of claim 24 wherein said generating said gain control signal further includes providing a log linear gain control signal such that said linear function has a predetermined gain slope.

26. The method of claim 24 wherein said generating said gain control signal further includes providing a log linear gain control signal and using said offset signal to compensate for offsets in the AGC system, due to one of voltage threshold and base emitter junction variations.

* * * * *